(12) United States Patent
Matsuo

(10) Patent No.: US 9,087,770 B2
(45) Date of Patent: Jul. 21, 2015

(54) SEMICONDUCTOR MEMORY DEVICE

(71) Applicant: Kabushiki Kaisha Toshiba, Minato-ku (JP)

(72) Inventor: Kouji Matsuo, Aichi-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 128 days.

(21) Appl. No.: 14/022,613

(22) Filed: Sep. 10, 2013

(65) Prior Publication Data
US 2014/0284542 A1    Sep. 25, 2014

Related U.S. Application Data

(60) Provisional application No. 61/803,512, filed on Mar. 20, 2013.

(51) Int. Cl.
*H01L 47/00* (2006.01)
*H01L 27/24* (2006.01)

(52) U.S. Cl.
CPC ................... *H01L 27/2481* (2013.01)

(58) Field of Classification Search
CPC ............... H01L 21/67225; H01L 21/67748; H01L 21/6838; H01L 27/1157; H01L 27/11582; H01L 27/2409; H01L 27/2427; H01L 45/06; H01L 45/1233; H01L 45/144

USPC .......... 257/2–4, 412, E29.002, 421; 438/102–104, 382, 403
See application file for complete search history.

(56) References Cited

U.S. PATENT DOCUMENTS

2012/0069625 A1    3/2012    Wada

FOREIGN PATENT DOCUMENTS

| | | |
|---|---|---|
| JP | 2010-141046 | 6/2010 |
| JP | 2010-251352 | 11/2010 |
| JP | 2011-90755 | 5/2011 |
| JP | 2011-205045 | 10/2011 |
| JP | 2012-69609 | 4/2012 |

*Primary Examiner* — Mark A Laurenzi
(74) *Attorney, Agent, or Firm* — Oblon, McClelland, Maier & Neustadt, L.L.P.

(57) ABSTRACT

According to one embodiment, a semiconductor memory device includes a plurality of first interconnects extending in a first direction, a plurality of second interconnects extending in a second direction crossing the first direction, and a memory element provided between the first interconnect and the second interconnect at a portion where the first interconnect crosses the second interconnect. The memory element includes a variable resistance film and a stress generating film stacked with the variable resistance film to apply stress to the variable resistance film in a surface direction.

20 Claims, 8 Drawing Sheets

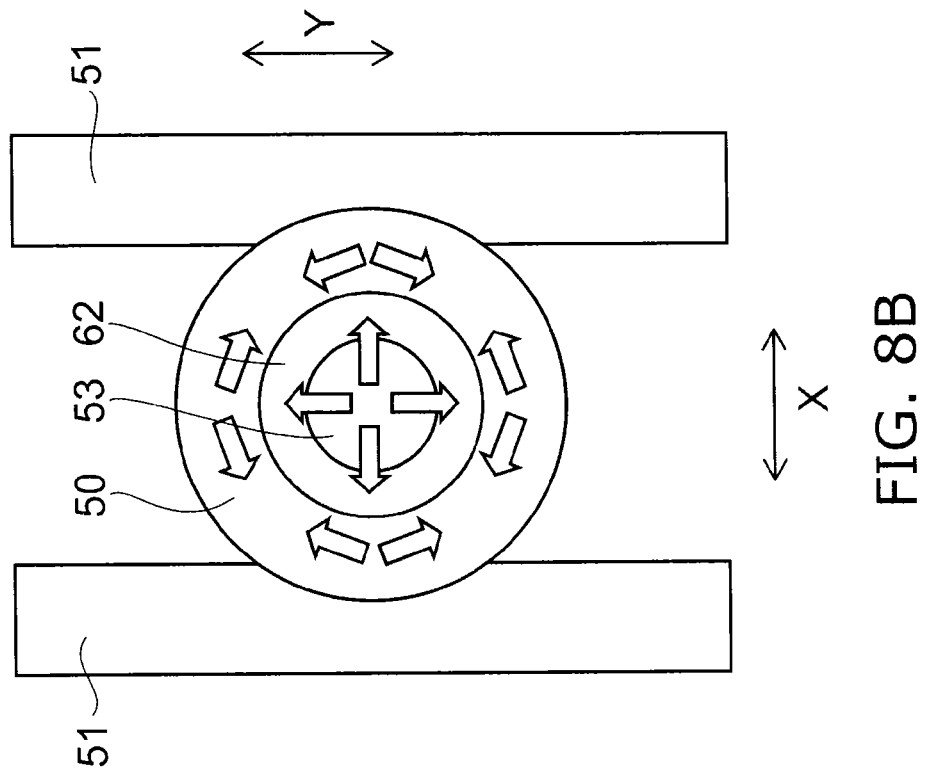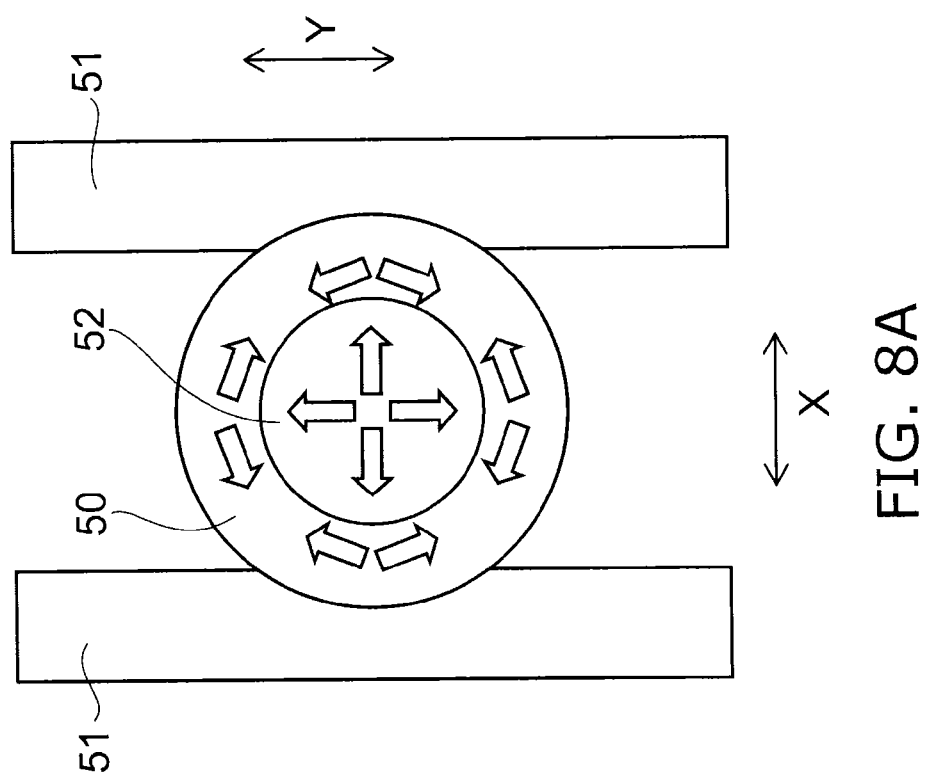

SEMICONDUCTOR MEMORY DEVICE

CROSS-REFERENCE TO RELATED APPLICATION

This application is based upon and claims the benefit of priority from U.S. Provisional Patent Application 61/803,512, filed on Mar. 20, 2013; the entire contents of which are incorporated herein by reference.

FIELD

Embodiments described herein relate generally to a semiconductor memory device.

BACKGROUND

A resistance change element has been proposed as a memory cell of a new nonvolatile semiconductor memory device. A variable resistance film can be switched to at least two resistance states having relatively different resistances by controlling the magnitude, polarity, and application time of the voltage applied to the variable resistance film, etc.

For example, an ion-movement type resistance change element has been proposed in which the resistance is changed by causing metal ions and/or oxygen ions inside the variable resistance film to move by an applied voltage.

BRIEF DESCRIPTION OF THE DRAWINGS

FIG. 7A to FIG. 8B are schematic cross-sectional views showing an example of a memory element of the semiconductor memory device of the second embodiment.

DETAILED DESCRIPTION

Figure 1:
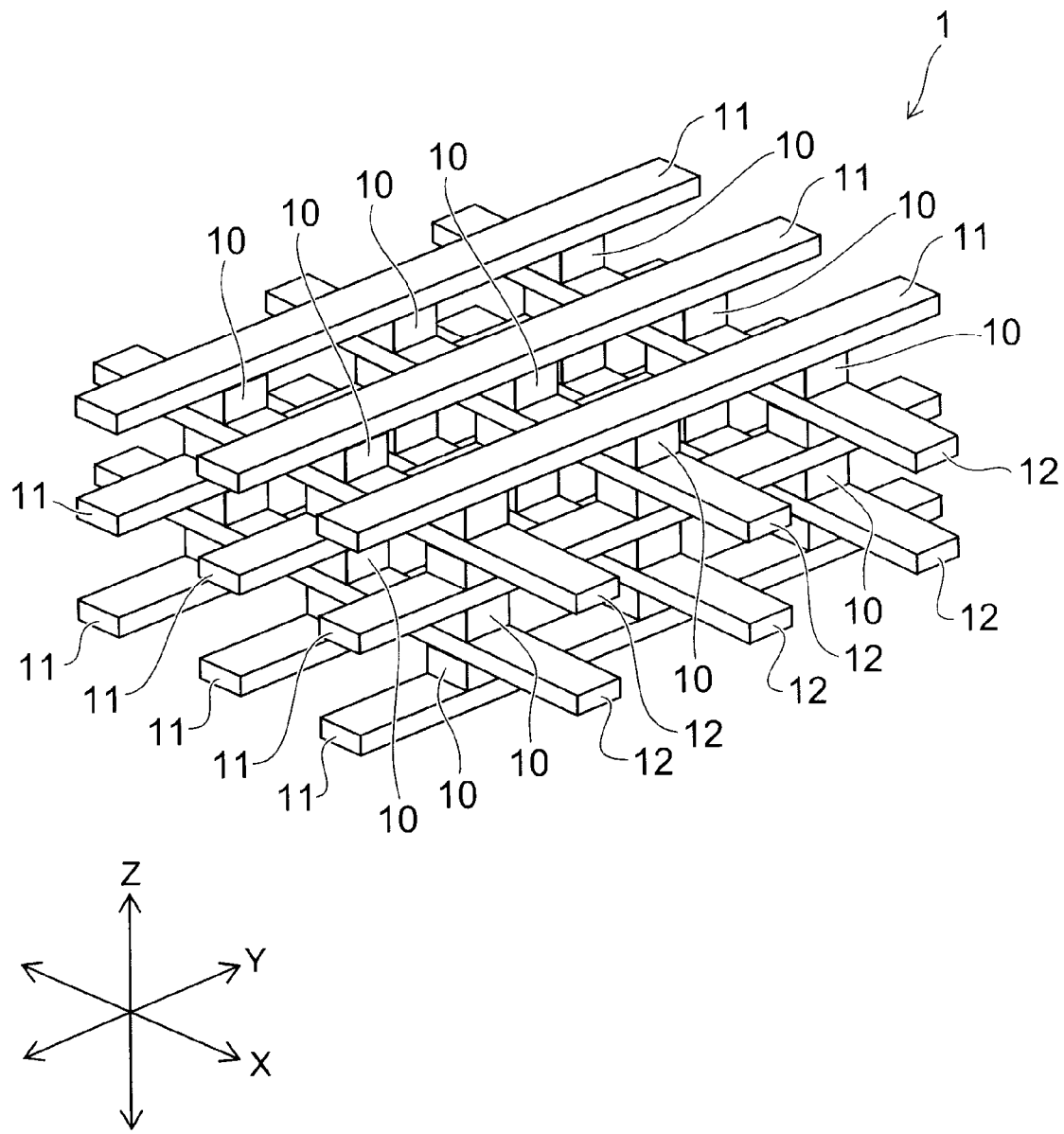
FIG. 1 is a schematic perspective view showing an example of a memory cell array of a semiconductor memory device of a first embodiment.

According to one embodiment, a semiconductor memory device includes a plurality of first interconnects extending in a first direction, a plurality of second interconnects extending in a second direction crossing the first direction, and a memory element provided between the first interconnect and the second interconnect at a portion where the first interconnect crosses the second interconnect. The memory element includes a variable resistance film and a stress generating film stacked with the variable resistance film to apply stress to the variable resistance film in a surface direction.

Various embodiments will be described hereinafter with reference to the accompanying drawings. Similar components in the drawings are marked with like reference numerals.

First Embodiment

FIG. 1 is a schematic perspective view of an example of a memory cell array 1 in a semiconductor memory device of a first embodiment.

The memory cell array 1 includes multiple first interconnects 11 and multiple second interconnects 12. Further, the memory cell array 1 includes stacked films 10 having columnar configurations provided between the first interconnects 11 and the second interconnects 12.

The first interconnects 11 and the second interconnects 12 cross each other three-dimensionally to be non-parallel. For example, the first interconnects 11 extend in a first direction (a Y direction); the second interconnects 12 extend in a second direction (an X direction) orthogonal to the first direction; and the first interconnects 11 and the second interconnects 12 are orthogonal to each other. Each of the multiple stacked films 10 is provided at a cross point where the first interconnect 11 and the second interconnect 12 cross each other.

The multiple stacked films 10 are disposed in two-dimensional directions (XY directions) in, for example, a matrix configuration; and an array having the matrix configuration is multiply stacked in a third direction (a Z direction) orthogonal to the XY plane.

FIG. 1 shows, for example, a portion in which 4 layers of an array of 3 rows by 3 columns are stacked.

The first interconnect 11 is shared by the stacked films 10 on and under the first interconnect 11. Similarly, the second interconnect 12 is shared by the stacked films 10 on and under the second interconnect 12.

The stacked film 10 includes a memory element (a memory cell).

Figure 2A:
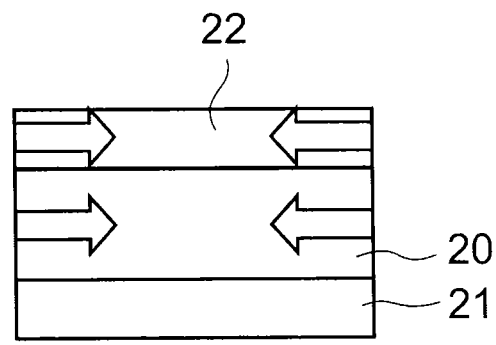
FIG. 2A to FIG. 5C are schematic cross-sectional views showing an example of a memory element of the semiconductor memory device of the first embodiment.

FIG. 2A is a schematic cross-sectional view showing an example of the memory element.

The memory element includes a lower layer electrode 21, an upper layer electrode 22, and a variable resistance film 20 that is provided between the lower layer electrode 21 and the upper layer electrode 22.

The variable resistance film 20 is stacked on the lower layer electrode 21; and the lower layer electrode 21 contacts the lower surface of the variable resistance film 20.

The upper layer electrode 22 is stacked on the variable resistance film 20 to contact the upper surface of the variable resistance film 20.

The variable resistance film 20 is electrically switchable between a state (a set state) in which the resistance is relatively low and a state (a reset state) in which the resistance is relatively high to nonvolatilely store data.

The variable resistance film 20 includes a metal oxide. For example, the variable resistance film 20 includes an oxide of at least one element selected from lithium (Li), manganese (Mn), tantalum (Ta), niobium (Nb), chromium (Cr), nickel (Ni), tungsten (W), cobalt (Co), iron (Fe), hafnium (Hf), titanium (Ti), silicon (Si), and zirconium (Zr).

The variable resistance film 20 in the low resistance state (the set state) which has a relatively low resistance can be switched to the high resistance state (the reset state) which has a relatively high resistance when a reset voltage is applied to the variable resistance film 20 via the interconnects 11 and 12 on and under the memory element subjected to the operation. The variable resistance film 20 can be switched to the low resistance state (the set state) when a set voltage that is higher than the reset voltage is applied to the variable resistance film 20 in the high resistance state (the reset state).

According to the embodiment, the resistance value is changed by electrically causing metal ions and/or oxygen ions inside the variable resistance film 20 to move. Such an ion-movement type resistance change element is largely considered to have two improvement points due to the material of the variable resistance film 20.

One point is that, because the ions move easily, even in the case where programming using the ion movement is performed, there is a high probability of the ions returning to the original positions; and the data retention characteristics degrade.

One other point is that the ions do not move easily; and the number of possible reads and programs decreases due to the ions undesirably moving while damaging the crystal of the main material.

It is considered that the former occurs because the paths of the ions inside the crystal of the main material are sufficiently large for the size of the ions; and the ions unfortunately can move easily.

It is considered that the latter occurs because the paths of the ions are so small that the crystal of the main material is undesirably damaged.

In either case, it is difficult to realize both a sufficient number of programs and a sufficient retention time of data.

For example, the variable resistance film 20 of the embodiment includes mainly $LiCoO_2$, $LiMn_2O_4$, $LiNiO_2$, $LiFePO_4$, etc., as the metal oxide.

The resistance of the variable resistance film 20 is changed by causing the Li ions to move to the lower layer electrode 21 vicinity and/or the upper layer electrode 22 vicinity by applying a voltage between the upper and lower electrodes 22 and 21.

However, because it is possible for the Li ions inside the Li oxide film to move easily, the Li ions easily return to the original positions when the voltage application is stopped.

Therefore, according to the embodiment, the lattice constant of the main material crystal of the variable resistance film 20 is adjusted by applying stress to the variable resistance film 20.

For example, in the example shown in FIG. 2A, compressive stress is applied to the variable resistance film 20 by stacking the upper layer electrode 22 that has compressive stress on the variable resistance film 20.

In the first embodiment, the direction of the stress of each of the films is the surface direction of the film.

The lattice constant in the surface direction of the variable resistance film 20 to which the compressive stress is applied by the upper layer electrode 22 becomes smaller than prior to the compressive stress being applied, that is, prior to forming the upper layer electrode 22. When the upper layer electrode 22 is peeled after forming the upper layer electrode 22, the compressive stress that had been applied to the variable resistance film 20 from the upper layer electrode 22 is relaxed; and the lattice constant in the surface direction of the variable resistance film 20 becomes larger than that of the state in which the upper layer electrode 22 was stacked on the variable resistance film 20.

The variable resistance film 20 itself may not have compressive stress. Even in the case where the variable resistance film 20 has tensile stress, the tensile stress of the variable resistance film 20 becomes smaller than prior to forming the upper layer electrode 22 by the formation of the upper layer electrode 22 that has compressive stress; and it is possible to reduce the lattice constant.

The change of the lattice constant (the lattice strain) can be analyzed by, for example, Nano Beam Electron Diffraction to obtain an electron diffraction pattern by irradiating a nanobeam having a diameter of several tens of nm.

By the lattice constant of the variable resistance film 20 becoming small, the paths of the Li ions become narrow; and the Li ions move less easily.

Thereby, it is possible to stably store the data memory state because the Li ions that move due to the voltage application are stored at substantially the same positions even after stopping the voltage application.

For example, a titanium nitride film formed by sputtering using a titanium target in a nitrogen atmosphere can be used as the upper layer electrode 22 which is the stress generating film. It is possible to generate the compressive stress and it is possible to adjust the magnitude of the stress by adjusting the film formation temperature and nitrogen content of the sputtering film formation of the titanium nitride film, etc. The upper layer electrode 22 is formed to have compressive stress that is, for example, not less than 1 GPa.

Also, a film other than the electrodes can be used as the stress generating film.

Figure 2B:
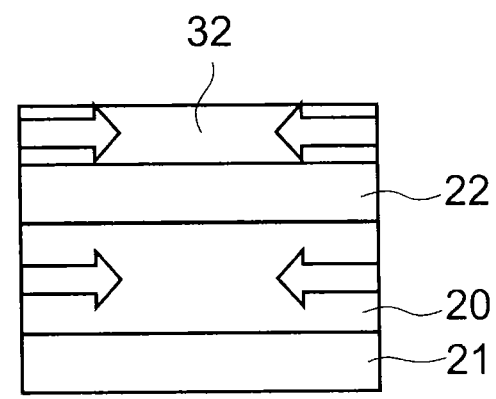

FIG. 2B shows the structure of a memory element in which a stress generating film 32 is stacked on the upper layer electrode 22.

The stress generating film 32 has compressive stress. The compressive stress of the stress generating film 32 is applied to the upper layer electrode 22, which is stacked under the stress generating film 32 and is in contact with the stress generating film 32, and is further applied to the variable resistance film 20 under the upper layer electrode 22.

The lattice constant in the surface direction of the variable resistance film 20 to which the compressive stress is applied by the stress generating film 32 becomes smaller than prior to the compressive stress being applied, that is, prior to forming the stress generating film 32. When the stress generating film 32 is peeled after forming the stress generating film 32, the compressive stress that had been applied to the variable resistance film 20 from the stress generating film 32 is relaxed; and the lattice constant in the surface direction of the variable resistance film 20 becomes larger than that of the state in which the stress generating film 32 was stacked on the variable resistance film 20.

In such a case as well, the variable resistance film 20 itself may not have compressive stress. Even in the case where the variable resistance film 20 has tensile stress, the tensile stress of the variable resistance film 20 becomes smaller than prior to forming the stress generating film 32 by the formation of the stress generating film 32 that has compressive stress; and it is possible to reduce the lattice constant.

By the lattice constant of the variable resistance film 20 becoming small, the paths of the Li ions become narrow; the Li ions move less easily; and it is possible to stably store the data memory state because the Li ions that move due to the voltage application are stored at the same positions even after stopping the voltage application.

The stress generating film 32 is an insulating film or a conductor film.

The stress generating film 32 is, for example, a silicon nitride film. Compressive stress can be applied to the silicon nitride film and the magnitude of the compressive stress can be adjusted by adjusting the nitrogen content (the nitrogen concentration) and/or film formation temperature of the silicon nitride film. The stress generating film 32 is formed to have, for example, compressive stress that is not less than 1 GPa.

Figure 2C:
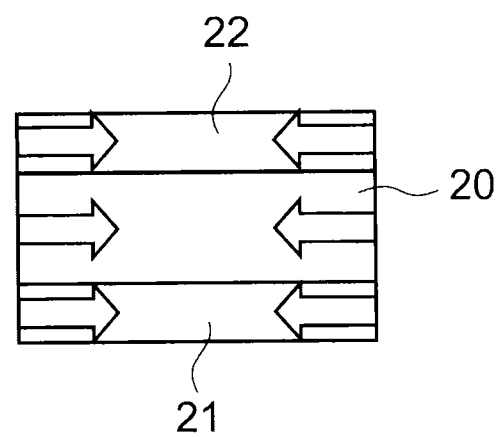

Also, as shown in FIG. 2C, compressive stress may be applied to both the upper layer electrode 22 and the lower layer electrode 21; and the compressive stress can be applied to the variable resistance film 20 from both the upper layer electrode 22 and the lower layer electrode 21. The upper layer electrode 22 and the lower layer electrode 21 have compressive stress that is in the surface direction of the film and in the same direction.

The lower layer electrode 21 may include the same film as the upper layer electrode 22, e.g., a titanium nitride film. By performing annealing after forming the variable resistance film 20 on the lower layer electrode 21, the compressive stress can be generated in the lower layer electrode 21; and the compressive stress can be applied to the variable resistance film 20 from the lower layer electrode 21.

Figure 3A:
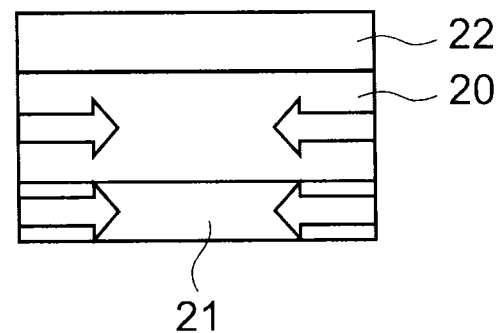

Also, as shown in FIG. 3A, a structure may be used in which only the lower layer electrode 21 is used as the stress generating film. By performing annealing after forming the variable resistance film 20 on the lower layer electrode 21, the compressive stress can be generated in the lower layer electrode 21; and the compressive stress can be applied to the variable resistance film 20 from the lower layer electrode 21.

Figure 3B:
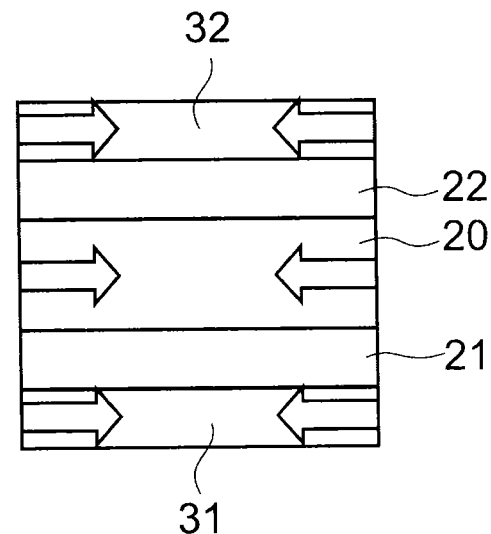

Further, as shown in FIG. 3B, a structure may be used in which a stacked body having the variable resistance film 20 interposed between the electrodes 21 and 22 is interposed between the stress generating film 32 and a stress generating film 31.

The lower layer electrode 21 is stacked on the stress generating film 31; and the stress generating film 32 is stacked on the upper layer electrode 22.

The stress generating film 31 on the lower side and the stress generating film 32 on the upper side have compressive stress that is in the surface direction of the film and in the same direction.

The stress generating film 31 and the stress generating film 32 are the same film, e.g., a silicon nitride film.

Figure 3C:
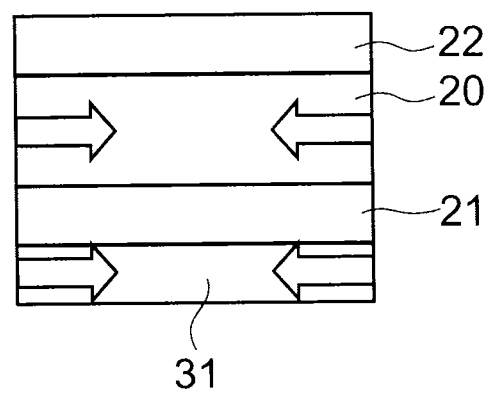

Also, as shown in FIG. 3C, the compressive stress may be applied to the variable resistance film 20 by only the stress generating film 31 stacked under the lower layer electrode 21.

By performing annealing after forming the variable resistance film 20 on the stress generating film 31 with the lower layer electrode 21 interposed, the compressive stress can be generated in the stress generating film 31; and the compressive stress can be applied from the stress generating film 31 to the variable resistance film 20 via the lower layer electrode 21.

The variable resistance film 20 is not limited to Li oxide and may have a structure including, for example, $Mn_3O_4$. There is a possibility that the crystal of the $Mn_3O_4$ which is used as the main material may be damaged when the Mn ions move inside the $Mn_3O_4$ due to the voltage application; and there are cases where the number of possible programs and erases becomes low.

Therefore, when the variable resistance film 20 includes $Mn_3O_4$, it is favorable to use a stress generating film that has tensile stress rather than compressive stress.

Thereby, it is possible to increase the lattice constant of the variable resistance film 20, widen the paths of the Mn ions, and drastically increase the number of possible programs and erases.

Further, the resistance can be changed by causing the oxygen ions to move inside the film by a voltage application for the variable resistance film 20 including a metal oxide such as TaOx, NbOx, CrOx, NiOx, WOx, CoOx, FeOx, HfOx, TiOx, SiOx, ZrOx, etc. In these films as well, the crystal is damaged easily because the paths of the oxygen ions are small.

Accordingly, it is possible to widen the paths of the oxygen ions and drastically increase the number of programs and erases by stacking a stress generating film that has tensile stress for the variable resistance film 20 in which the movement of the oxygen ions contributes to the resistance change.

Figure 4A:
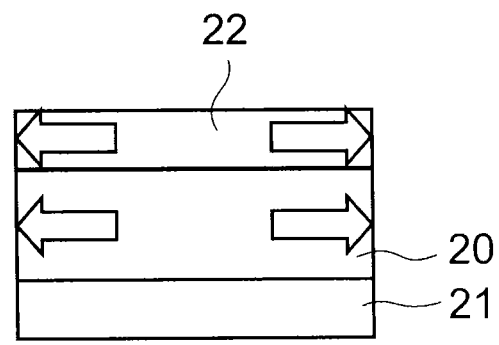

In the example shown in FIG. 4A, tensile stress is applied to the variable resistance film 20 by stacking the upper layer electrode 22 that has tensile stress on the variable resistance film 20.

The lattice constant in the surface direction of the variable resistance film 20 to which the tensile stress is applied by the upper layer electrode 22 becomes larger than prior to the tensile stress being applied, that is, prior to forming the upper layer electrode 22. When the upper layer electrode 22 is peeled after forming the upper layer electrode 22, the tensile stress that had been applied to the variable resistance film 20 from the upper layer electrode 22 is relaxed; and the lattice constant in the surface direction of the variable resistance film 20 becomes smaller than that of the state in which the upper layer electrode 22 was stacked on the variable resistance film 20.

The variable resistance film 20 itself may not have tensile stress. Even in the case where the variable resistance film 20 has compressive stress, the compressive stress of the variable resistance film 20 becomes smaller than prior to forming the upper layer electrode 22 by the formation of the upper layer electrode 22 that has tensile stress; and it is possible to increase the lattice constant.

By the lattice constant of the variable resistance film 20 becoming large, the paths of the ions widen; and the ions move more easily.

Thereby, the crystal damage due to the movement of the ions can be suppressed; and it is possible to drastically increase the number of possible programs and erases.

For example, a titanium nitride film formed by sputtering using a titanium target in a nitrogen atmosphere can be used as the upper layer electrode 22 which is the tensile stress generating film. By adjusting the nitrogen content and/or film formation temperature of the titanium nitride film, it is possible to generate tensile stress in the titanium nitride film; and it is possible to adjust the magnitude of the tensile stress.

For example, it is possible to change a compressive stress of about 1 GPa to a tensile stress of several hundred MPa by reducing the DC power and by reducing the TiN density in DC (direct current) sputtering.

A film other than the electrodes can be used as the tensile stress generating film.

Figure 4B:
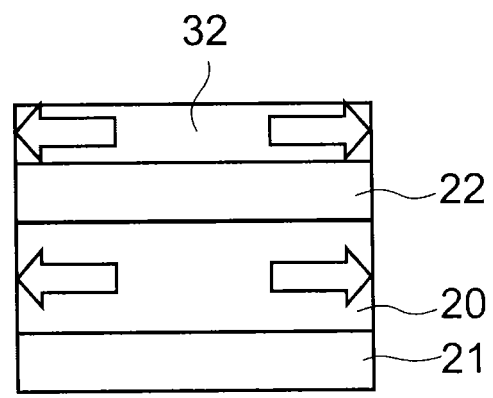

FIG. 4B shows the structure of a memory element in which the stress generating film 32 is stacked on the upper layer electrode 22.

The stress generating film 32 has tensile stress. The tensile stress of the stress generating film 32 is applied to the upper layer electrode 22, which is stacked under the stress generating film 32 and is in contact with the stress generating film 32, and is further applied to the variable resistance film 20 under the upper layer electrode 22.

The lattice constant in the surface direction of the variable resistance film 20 to which the tensile stress is applied by the stress generating film 32 becomes larger than prior to the tensile stress being applied, that is, prior to forming the stress generating film 32. When the stress generating film 32 is peeled after forming the stress generating film 32, the tensile stress that had been applied to the variable resistance film 20 from the stress generating film 32 is relaxed; and the lattice constant in the surface direction of the variable resistance film 20 becomes smaller than that of the state in which the stress generating film 32 was stacked on the variable resistance film 20.

In such a case as well, the variable resistance film 20 itself may not have tensile stress. Even in the case where the variable resistance film 20 has compressive stress, the compressive stress of the variable resistance film 20 becomes smaller than prior to forming the stress generating film 32 by the formation of the stress generating film 32 that has tensile stress; and it is possible to increase the lattice constant.

By the lattice constant of the variable resistance film 20 becoming large, the paths of the ions widen; the ions move more easily; the crystal damage due to the movement of the ions can be suppressed; and it is possible to drastically increase the number of possible programs and erases.

The stress generating film 32 is an insulating film or a conductor film.

The stress generating film 32 is, for example, a silicon nitride film. By adjusting the nitrogen content (the nitrogen concentration) and/or film formation temperature of the silicon nitride film, tensile stress can be applied to the silicon nitride film; and the magnitude of the tensile stress can be adjusted. The stress generating film 32 is formed to have tensile stress that is, for example, not less than 1 GPa.

Figure 4C:
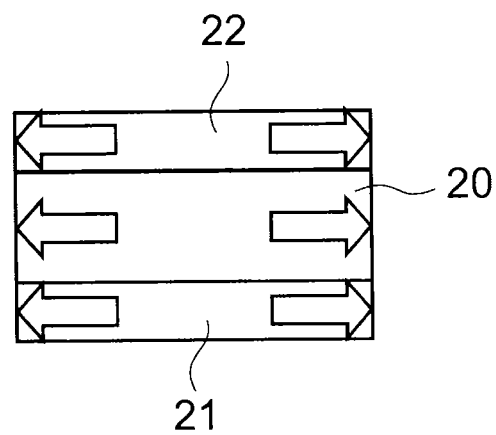

Also, as shown in FIG. 4C, the tensile stress can be applied to both the upper layer electrode 22 and the lower layer electrode 21; and the tensile stress can be applied to the variable resistance film 20 from both the upper layer electrode 22 and the lower layer electrode 21. The upper layer electrode 22 and the lower layer electrode 21 have tensile stress that is in the surface direction of the film and in the same direction.

The lower layer electrode 21 may include the same film as the upper layer electrode 22, e.g., a titanium nitride film. By performing annealing after forming the variable resistance film 20 on the lower layer electrode 21, the tensile stress can be generated in the lower layer electrode 21; and the tensile stress can be applied to the variable resistance film 20 from the lower layer electrode 21.

Figure 5A:
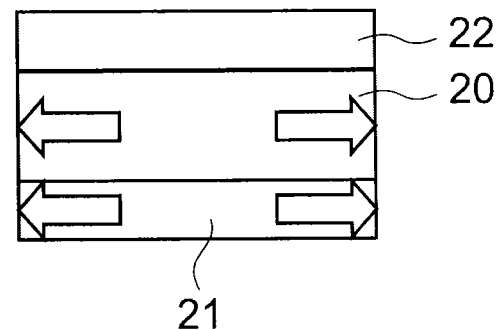

Further, as shown in FIG. 5A, a structure may be used in which only the lower layer electrode 21 is used as the stress generating film. By performing annealing after forming the variable resistance film 20 on the lower layer electrode 21, the tensile stress can be generated in the lower layer electrode 21; and the tensile stress can be applied to the variable resistance film 20 from the lower layer electrode 21.

Figure 5B:
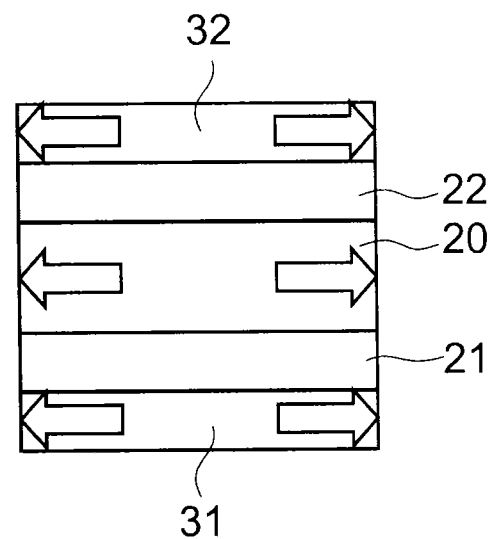

Also, as shown in FIG. 5B, a structure may be used in which a stacked body having the variable resistance film 20 interposed between the electrodes 21 and 22 is interposed between the stress generating film 32 and the stress generating film 31.

The lower layer electrode 21 is stacked on the stress generating film 31; and the stress generating film 32 is stacked on the upper layer electrode 22.

The stress generating film 31 on the lower side and the stress generating film 32 on the upper side have tensile stress that is in the surface direction of the film and in the same direction.

The stress generating film 31 and the stress generating film 32 are the same film, e.g., a silicon nitride film.

Figure 5C:
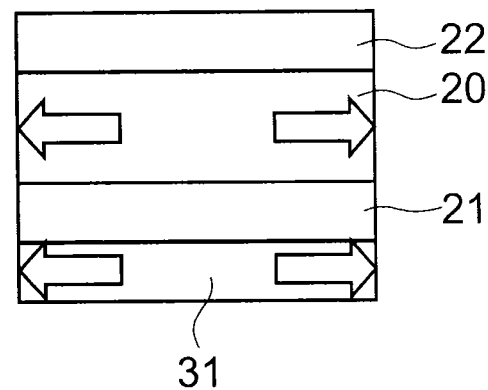

Also, as shown in FIG. 5C, the tensile stress may be applied to the variable resistance film 20 by only the stress generating film 31 stacked under the lower layer electrode 21.

By performing annealing after forming the variable resistance film 20 on the stress generating film 31 with the lower layer electrode 21 interposed, the tensile stress can be generated in the stress generating film 31; and the tensile stress can be applied from the stress generating film 31 to the variable resistance film 20 via the lower layer electrode 21.

Second Embodiment

Figure 6:
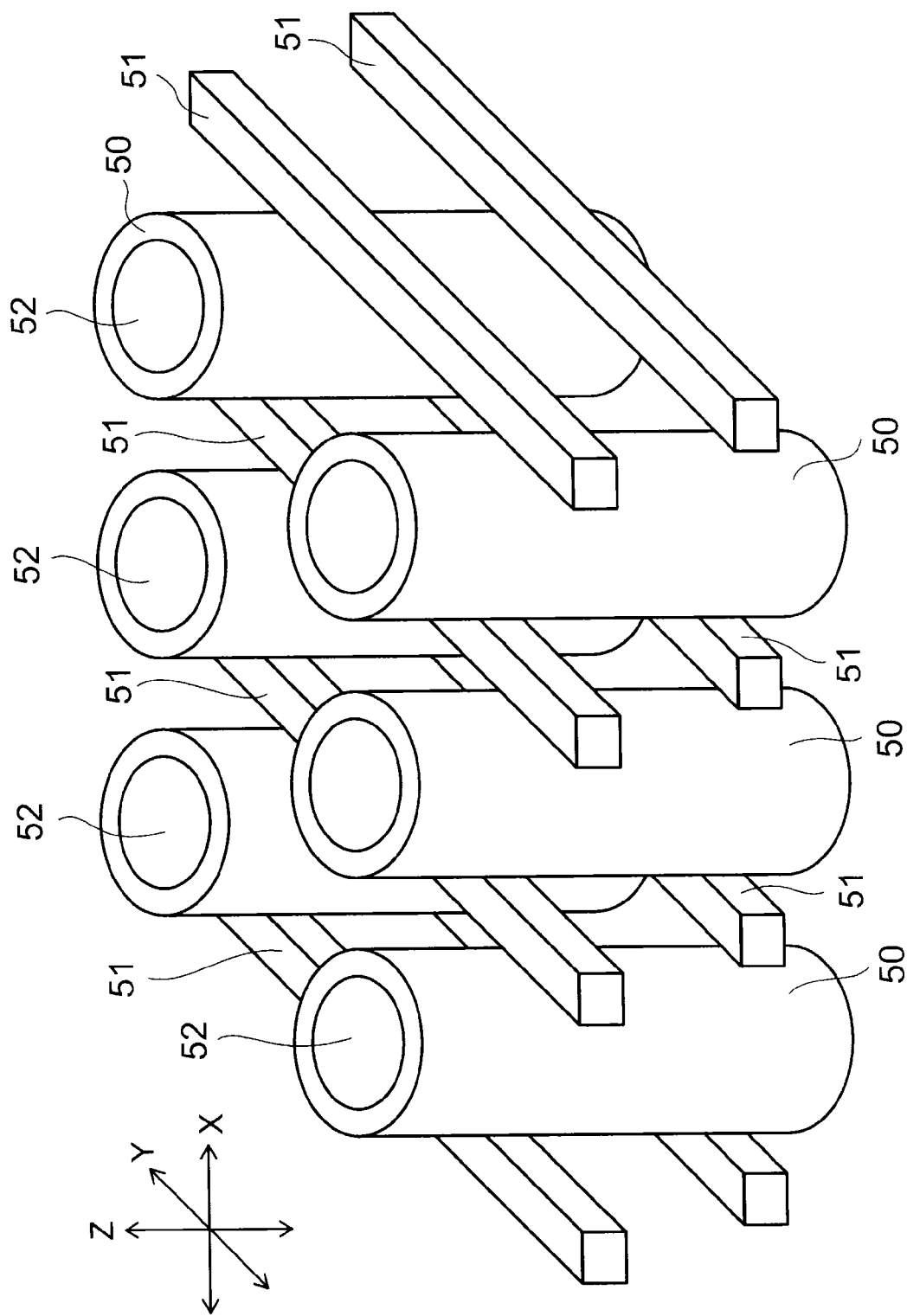
FIG. 6 is a schematic perspective view showing an example of a memory cell array of a semiconductor memory device of a second embodiment.

FIG. 6 is a schematic perspective view showing an example of a memory cell array of a semiconductor memory device of a second embodiment.

The memory cell array of the second embodiment is provided on a not-shown substrate and includes multiple variable resistance films 50 having tubular configurations extending in the Z direction (first direction) perpendicular to a major surface of the substrate.

Here, two directions that are orthogonal to each other in a plane parallel to the major surface of the substrate and orthogonal to the Z direction are taken as the X direction (second direction) and the Y direction (third direction).

Center electrodes 52 having columnar configurations extending in the Z direction are provided inside the variable resistance films 50. The variable resistance films 50 are provided at the outer circumferences of the center electrodes 52 having the columnar configurations.

The multiple center electrodes 52 and the multiple variable resistance films 50 are disposed in a matrix configuration when the major surface of the substrate is viewed in plan.

Multiple outer electrodes 51 are multiply arranged in the X direction to be disposed between the center electrodes 52. Here, the outer electrodes 51 are provided between the variable resistance films 50 that are adjacent to each other in the X direction; and the outer electrodes 51 are shared by the variable resistance films 50 that are adjacent to each other in the X direction.

The outer electrodes 51 extend in the Y direction. Here, the outer electrodes 51 are shared by the variable resistance films 50 of the center electrodes 52 that are adjacent to each other in the Y direction. Also, the outer electrodes 51 are stacked in the Z direction with a not-shown inter-layer insulating film interposed.

The variable resistance film 50 includes a metal oxide. The variable resistance film 50 includes, for example, an oxide of at least one element selected from lithium (Li), manganese (Mn), tantalum (Ta), niobium (Nb), chromium (Cr), nickel (Ni), tungsten (W), cobalt (Co), iron (Fe), hafnium (Hf), titanium (Ti), silicon (Si), and zirconium (Zr).

When a voltage is applied to the center electrode 52 and the outer electrode 51, the ions of the region of the variable resistance film 50 interposed between the center electrode 52 and the outer electrode 51 move; the resistance of the region changes; and the programming and erasing of data are performed.

Two data can be stored by two outer electrodes 51 of the same layer being disposed at one center electrode 52 with the variable resistance film interposed in the X direction.

In the second embodiment as well, stress is applied to the variable resistance film 50.

Figure 7B:
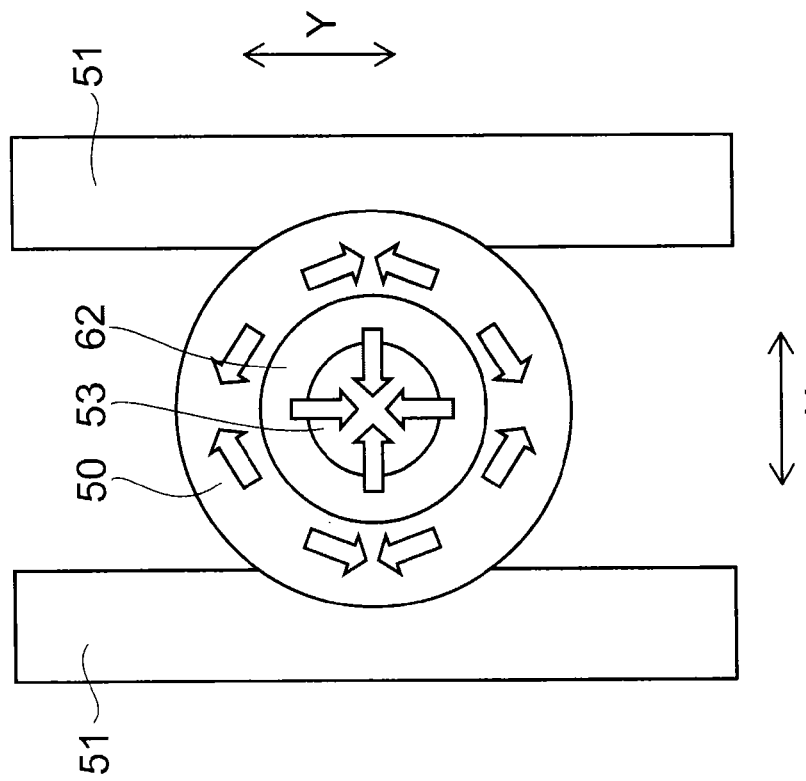
Figure 7A:
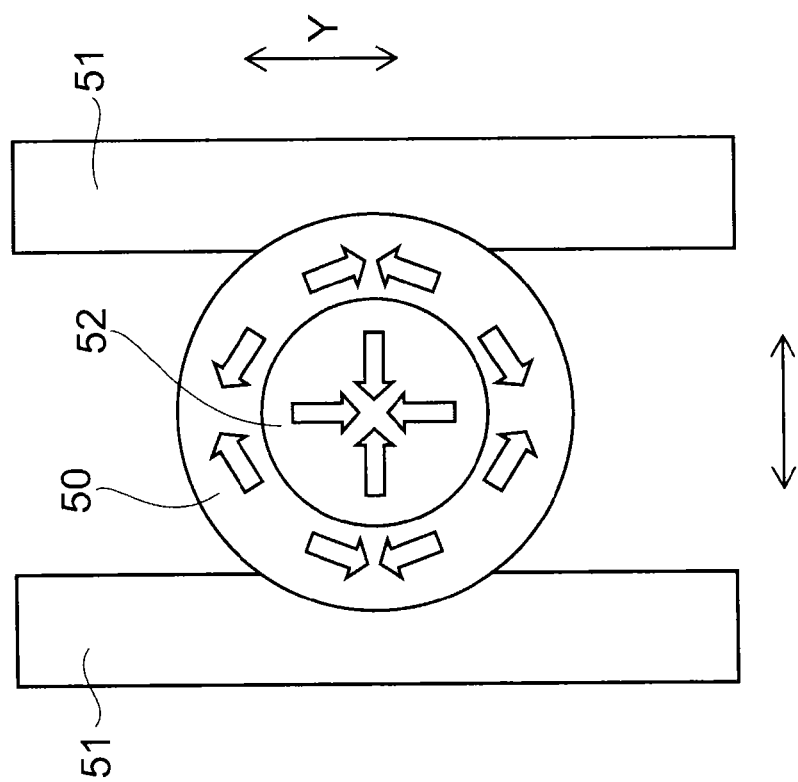

FIG. 7A is a schematic cross-sectional view of one variable resistance film 50 and a pair of outer electrodes 51 having the variable resistance film 50 interposed in the X direction and corresponds to a cross section parallel to the XY plane of FIG. 6.

For example, the variable resistance film 50 includes mainly $LiCoO_2$, $LiMn_2O_4$, $LiNiO_2$, $LiFePO_4$, etc., as the metal oxide.

In the example shown in FIG. 7A, stress is applied to the variable resistance film 50 by generating stress in the center electrode 52 that is provided in the columnar configuration inside the variable resistance film 50.

In the second embodiment, the direction of the stress of the stress generating film having the columnar configuration is the central direction; and the direction of the stress of the variable resistance film 50 having the tubular configuration is the circumferential direction.

Compressive stress that is in the circumferential direction or the Y direction is generated in the center electrode 52 that is used as the stress generating film at the portion opposing the outer electrode 51 with the variable resistance film 50 interposed. The compressive stress is applied to the portion of the variable resistance film 50 that is interposed between the outer electrode 51 and the center electrode 52.

Thereby, the lattice constant in the circumferential direction or the Y direction of the variable resistance film 50 at the portion interposed between the outer electrode 51 and the center electrode 52 becomes smaller than prior to the compressive stress being applied, that is, prior to forming the center electrode 52. When the center electrode 52 is removed, the compressive stress that had been applied to the variable resistance film 50 from the center electrode 52 is relaxed; and the lattice constant in the circumferential direction or the Y direction of the variable resistance film 50 at the portion interposed between the outer electrode 51 and the center electrode 52 becomes larger than that of the state in which the center electrode 52 had been formed.

By the lattice constant of the variable resistance film 50 at the portion interposed between the outer electrode 51 and the center electrode 52 becoming small, the paths of the Li ions become narrow; and the Li ions move less easily.

Thereby, it is possible to stably store the data memory state because the Li ions that move due to the voltage application are stored at the same positions even after stopping the voltage application.

After making multiple holes in a stacked body on the substrate to extend in the Z direction, the variable resistance film 50 is formed in tubular configurations at the inner circumferential walls of the holes.

Continuing, the center electrode 52 is formed as a film inside the variable resistance film 50. For example, a titanium nitride film formed by sputtering using a titanium target in a nitrogen atmosphere can be used as the center electrode 52 which is the stress generating film.

Then, in the example shown in FIG. 7B, a center electrode 62 is provided in a tubular configuration inside the variable resistance film 50; and a stress generating film 53 having a columnar configuration extending in the Z direction is provided inside the center electrode 62.

The direction of the stress of the stress generating film 53 having the columnar configuration is the central direction. The stress is applied to the center electrode 62, and is further applied as compressive stress to the portion of the variable resistance film 50 interposed between the outer electrode 51 and the center electrode 52.

Thereby, the lattice constant in the circumferential direction or the Y direction of the variable resistance film 50 at the portion interposed between the outer electrode 51 and the center electrode 52 becomes smaller than prior to the compressive stress being applied, that is, prior to forming the stress generating film 53. When the stress generating film 53 is removed, the stress that had been applied to the variable resistance film 50 from the stress generating film 53 is relaxed; and the lattice constant in the circumferential direction or the Y direction of the variable resistance film 50 at the portion interposed between the outer electrode 51 and the center electrode 52 becomes larger than that of the state in which the stress generating film 53 had been formed.

By the lattice constant of the variable resistance film 50 at the portion interposed between the outer electrode 51 and the center electrode 52 becoming small, the paths of the Li ions become narrow; and the Li ions move less easily.

Thereby, it is possible to stably store the data memory state because the Li ions that move due to the voltage application are stored at the same positions even after stopping the voltage application.

After making multiple holes in a stacked body on the substrate to extend in the Z direction, the variable resistance film 50 is formed in tubular configurations at the inner circumferential walls of the holes.

Continuing, the center electrode 62 is formed in tubular configurations at the inner circumferential walls of the variable resistance film 50.

Continuing, the stress generating film 53 is formed inside the center electrode 62.

The stress generating film 53 is an insulating film or a conductor film. The stress generating film 53 is, for example, a silicon nitride film.

Also, similarly to the first embodiment, it is possible to widen the paths of the ions and drastically increase the number of programs and erases by applying tensile stress in the circumferential direction or the Y direction to the portion of the variable resistance film 50 that includes an oxide of at least one element selected from manganese, tantalum, niobium, chromium, nickel, tungsten, cobalt, iron, hafnium, titanium, silicon, and zirconium and is between the outer electrode 51 and the center electrode 52.

In the example shown in FIG. 8A, stress is applied to the variable resistance film 50 by generating stress in the center electrode 52 that is provided in a columnar configuration inside the variable resistance film 50 to cause the center electrode 52 to expand in the outer circumferential direction.

Tensile stress is generated in the circumferential direction or the Y direction in the center electrode 52 that is used as the stress generating film at the portion opposing the outer electrode 51 with the variable resistance film 50 interposed. The tensile stress is applied to the portion of the variable resistance film 50 interposed between the outer electrode 51 and the center electrode 52.

Thereby, the lattice constant in the circumferential direction or the Y direction of the variable resistance film 50 at the portion interposed between the outer electrode 51 and the center electrode 52 becomes larger than prior to the tensile stress being applied, that is, prior to forming the center electrode 52. When the center electrode 52 is removed, the tensile stress that had been applied to the variable resistance film 50 from the center electrode 52 is relaxed; and the lattice constant in the circumferential direction or the Y direction of the variable resistance film 50 at the portion interposed between the outer electrode 51 and the center electrode 52 becomes smaller than that of the state in which the center electrode 52 had been formed.

By the lattice constant of the variable resistance film 50 at the portion interposed between the outer electrode 51 and the center electrode 52 becoming large, the paths of the ions widen; and the ions move more easily.

Thereby, the crystal damage due to the movement of the ions can be suppressed; and it is possible to drastically increase the number of possible programs and erases.

Then, in the example shown in FIG. 8B, the center electrode 62 is provided in a tubular configuration inside the variable resistance film 50; and the stress generating film 53 having a columnar configuration extending in the Z direction is provided inside the center electrode 62.

Stress is generated in the stress generating film 53 having the columnar configuration to cause the stress generating film 53 to expand in the outer circumferential direction. The stress is applied to the center electrode 62 and is further applied as tensile stress to the portion of the variable resistance film 50 interposed between the outer electrode 51 and the center electrode 52.

Thereby, the lattice constant in the circumferential direction or the Y direction of the variable resistance film 50 at the portion interposed between the outer electrode 51 and the center electrode 52 becomes larger than prior to the tensile stress being applied, that is, prior to forming the stress generating film 53. When the stress generating film 53 is removed, the tensile stress that had been applied to the variable resistance film 50 from the stress generating film 53 is relaxed; and the lattice constant in the circumferential direction or the Y direction of the variable resistance film 50 at the portion interposed between the outer electrode 51 and the center electrode 52 becomes smaller than that of the state in which the stress generating film 53 had been formed.

By the lattice constant of the variable resistance film 50 at the portion interposed between the outer electrode 51 and the center electrode 52 becoming large, the paths of the ions widen; and the ions move more easily.

Thereby, the crystal damage due to the movement of the ions can be suppressed; and it is possible to drastically increase the number of possible programs and erases.

According to the embodiments described above, stress is applied to the variable resistance film; and the lattice constant of the variable resistance film is adjusted appropriately according to the main material crystal and/or type of the mobile ions of the variable resistance film. Thereby, the decrease of the number of possible programs and erases due to the damage of the main material crystal due to the ion movement inside the variable resistance film or the degradation of the data retention characteristics due to the ease of the ion movement inside the variable resistance film can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of first interconnects extending in a first direction;
   a plurality of second interconnects extending in a second direction crossing the first direction; and
   a memory element provided between the first interconnect and the second interconnect at a portion where the first interconnect crosses the second interconnect,
   the memory element including:
      a variable resistance film; and
      a stress generating film stacked with the variable resistance film to apply stress to the variable resistance film in a surface direction.

2. The semiconductor memory device according to claim 1, wherein the stress generating film is an electrode stacked on or under the variable resistance film to contact the variable resistance film.

3. The semiconductor memory device according to claim 2, wherein the electrode is a titanium nitride film.

4. The semiconductor memory device according to claim 1, wherein the memory element includes:
   a lower layer electrode;
   the variable resistance film stacked on the lower layer electrode; and
   an upper layer electrode stacked on the variable resistance film.

5. The semiconductor memory device according to claim 4, wherein the stress generating film is the upper layer electrode and the lower layer electrode, and the upper layer electrode and the lower layer electrode have stress in a same direction.

6. The semiconductor memory device according to claim 5, wherein the upper layer electrode and the lower layer electrode are titanium nitride films.

7. The semiconductor memory device according to claim 4, wherein the stress generating film is stacked on the upper layer electrode or under the lower layer electrode.

8. The semiconductor memory device according to claim 7, wherein the stress generating film is a silicon nitride film.

9. The semiconductor memory device according to claim 4, wherein
   the stress generating film is stacked under the lower layer electrode and on the upper layer electrode,
   the stress generating film stacked under the lower layer electrode and the stress generating film stacked on the upper layer electrode have stress in a same direction.

10. The semiconductor memory device according to claim 9, wherein the stress generating film is a silicon nitride film.

11. The semiconductor memory device according to claim 1, wherein the variable resistance film includes lithium oxide.

12. The semiconductor memory device according to claim 11, wherein the stress generating film has compressive stress.

13. The semiconductor memory device according to claim 1, wherein the variable resistance film includes an oxide of at least one element selected from manganese, tantalum, niobium, chromium, nickel, tungsten, cobalt, iron, hafnium, titanium, silicon, and zirconium.

14. The semiconductor memory device according to claim 13, wherein the stress generating film has tensile stress.

15. A semiconductor memory device, comprising:
   a variable resistance film having a tubular configuration extending in a first direction;
   a plurality of outer electrodes provided with the variable resistance film interposed in a second direction crossing the first direction, the plurality of outer electrodes extending in a third direction crossing the first direction and the second direction; and
   a stress generating film provided inside the variable resistance film to apply stress to the variable resistance film in a circumferential direction.

16. The semiconductor memory device according to claim 15, wherein the stress generating film is a center electrode having a columnar configuration provided inside the variable resistance film to extend in the first direction.

17. The semiconductor memory device according to claim 16, wherein the center electrode is a titanium nitride film.

18. The semiconductor memory device according to claim 15, further comprising a center electrode having a tubular configuration provided inside the variable resistance film to extend in the first direction,
   the stress generating film being provided inside the center electrode to extend in a columnar configuration in the first direction.

19. The semiconductor memory device according to claim 18, wherein the stress generating film is a silicon nitride film.

20. The semiconductor memory device according to claim 15, wherein the variable resistance film includes a metal oxide.

* * * * *